US007304857B2

(12) United States Patent
Yamashita

(10) Patent No.: US 7,304,857 B2
(45) Date of Patent: Dec. 4, 2007

(54) SENSOR NODE AND CIRCUIT BOARD ARRANGEMENT

(75) Inventor: Shunzo Yamashita, Musashino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/933,270

(22) Filed: Sep. 3, 2004

(65) Prior Publication Data
US 2005/0200002 A1  Sep. 15, 2005

(30) Foreign Application Priority Data
Mar. 9, 2004 (JP) ............................. 2004-064973

(51) Int. Cl.
*H05K 7/00* (2006.01)
(52) U.S. Cl. .................. 361/760; 361/803; 361/780; 361/764; 361/782; 361/783; 361/784; 361/785; 361/792; 361/793; 361/794; 361/795; 361/814; 257/723
(58) Field of Classification Search ............... 361/780, 361/803, 760, 764, 782–785, 792–795, 814; 257/723; 128/903; 324/158.1, 73.1; 333/12, 333/246–247; 343/185, 702; 455/73; 439/55, 439/68; 600/300, 310, 549, 595
See application file for complete search history.

(56) References Cited

U.S. PATENT DOCUMENTS

| 4,616,655 | A  | * | 10/1986  | Weinberg et al. .............. 607/2 |
| 6,064,116 | A  | * | 5/2000   | Akram ........................ 257/723 |
| 6,487,082 | B1 | * | 11/2002  | Crapisi et al. ............... 361/760 |
| 6,672,174 | B2 | * | 1/2004   | Deconde et al. ........ 73/862.046 |
| 6,889,084 | B2 | * | 5/2005   | Thompson et al. ............ 607/36 |
| 6,903,910 | B1 | * | 6/2005   | Griesing et al. .............. 361/38 |
| 6,924,496 | B2 | * | 8/2005   | Manansala ................. 250/556 |

(Continued)

FOREIGN PATENT DOCUMENTS

JP         11-007596         6/1997

(Continued)

OTHER PUBLICATIONS

Sokwoo Rhee et al., "Artifact-Resistant Power-Efficient Design of Finger-Ring Plethysmographic Sensors", IEEE Transactions on Biomedical Engineering, vol. 48, No. 7 (Jul. 2001), pp. 795-805.

(Continued)

*Primary Examiner*—Dean A. Reichard
*Assistant Examiner*—Hoa C Nguyen
(74) *Attorney, Agent, or Firm*—Reed Smith LLP; Stanley P. Fisher, Esq.; Juan Carlos A. Marquez, Esq.

(57) ABSTRACT

An electronic circuit, preferable as a sensor node, has a highly sensitive radio function and is capable of performing a low-power-consumption operation. The electronic device has a board; a connector for connecting a sensor; a first signal processor circuit receiving an input of sensor data from the sensor through the connector and forming transmission data; and a second signal processor circuit converting a transmission signal from the first signal processor circuit into a high-frequency signal. The connector and the first signal processor circuit are mounted on a first surface of the board, and the second signal processor circuit is mounted on a second surface of the board.

5 Claims, 12 Drawing Sheets

U.S. PATENT DOCUMENTS

2003/0169211 A1 9/2003 Kawai et al.
2003/0184944 A1 10/2003 Hattori
2004/0015199 A1* 1/2004 Thompson et al. ........... 607/36
2004/0023701 A1 2/2004 Hankui

FOREIGN PATENT DOCUMENTS

JP 2001-127652 10/1999

OTHER PUBLICATIONS

Crossbow, "Smarter Sensors in Silicon", 20 pages (undated).

"Popularly Used Micro-Force Radio Devices", in Japanese, 3 pages (undated).

Data Sheet CR2032, Maxell, 2 pages (undated).

Crossbow, "Smarter Sensors in Silicon", *Commercial product based on Berkeley MICAs*, (2003) http://www.xbow.com, 20 pages.

"Popularly Used Micro-Force Radio Devices", (1989) in Japanese, 3 pages.

JPO Office Action dated Aug. 7, 2007 in Japanese and English.

* cited by examiner

FIG. 9
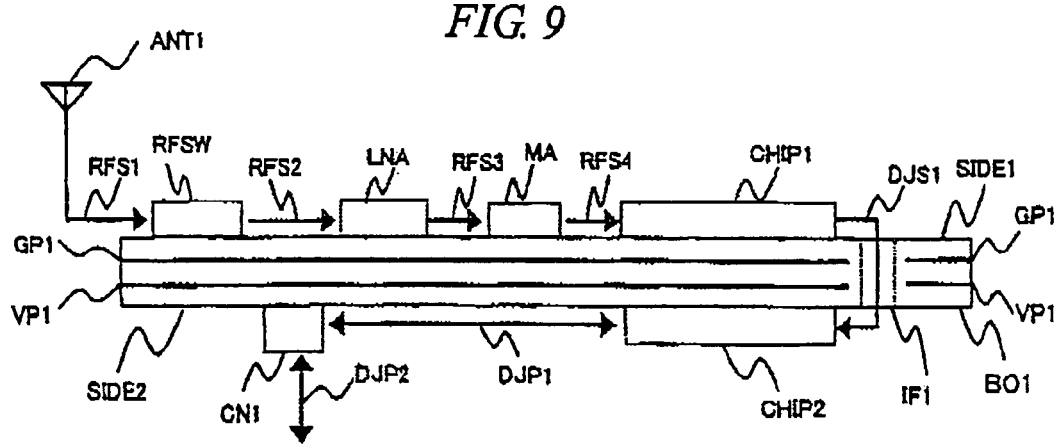
FIG. 10A
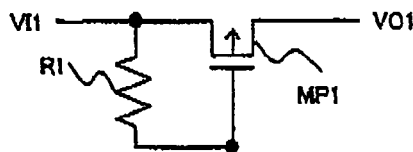
FIG. 10B
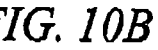
FIG. 10C
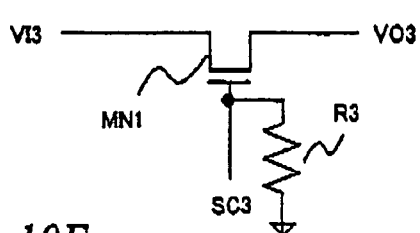
FIG. 10D
FIG. 10E
SC5 ——————— VO5

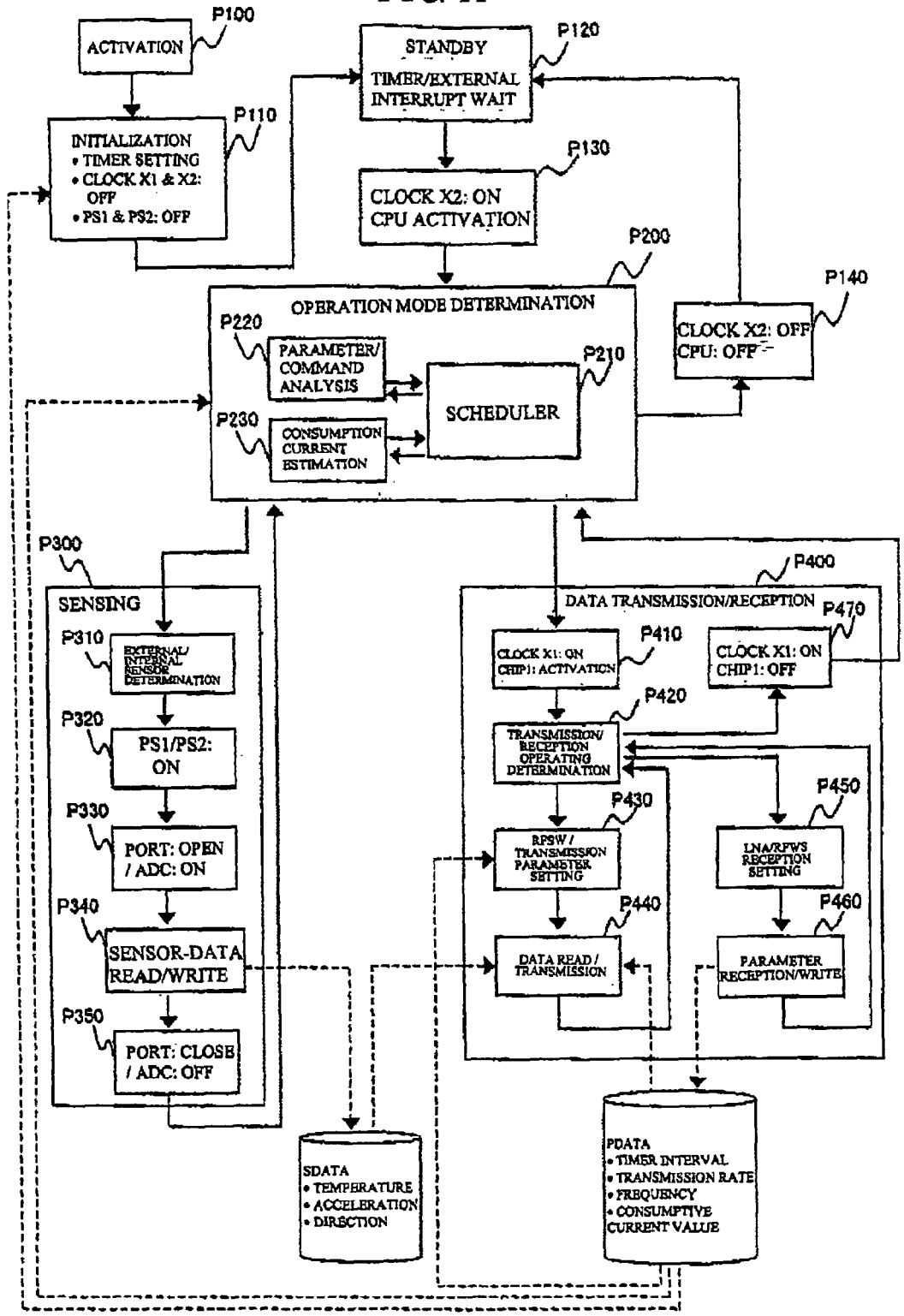

*FIG. 17*

| CHIP ID | SENSOR ID | TEMPERATURE | TIME | • • • |
|---------|-----------|-------------|------|-------|
| #1 | #1 | +25°C | | |
| #2 | #3 | +18°C | | |
| #3 | #2 | +20°C | | |
| #4 | #1 | +24°C | | |
| ⋮ | ⋮ | ⋮ | ⋮ | ⋮ |

PD1

SENSOR NODE AND CIRCUIT BOARD ARRANGEMENT

CROSS-REFERENCE TO RELATED APPLICATION

The present application claims priority from Japanese patent application No. JP 2004-064973 filed on Mar. 9, 2004, the content of which is hereby incorporated by reference into this application.

BACKGROUND OF THE INVENTION

The present invention relates to an electronic circuit equipped with a radio communication function. More specifically, the invention relates to a small and low-power-consumption electronic circuit effectively applied to construct a sensor network system.

In recent years, there has been considered a network system (hereinafter abbreviated as "sensor net" for capturing in real time various real-world information into an information-processing device by adding, to a sensor, a small electronic circuit having a radio communication function. For the sensor net, widespread application is considered. For example, there is also considered the application to a medical technology for: always monitoring the pulse etc. through a small finger-ring type electronic circuit in which a radio circuit, a processor, a sensor, and a battery are integrated; transmitting a result of the monitoring to a diagnostic unit by radio communication; and determining a health condition based on the result of the monitoring (see Non-Patent Document 1: Sokwoo Rhee et al, "Artifact-Resistant Power-Efficient Design of Finger-Ring Plethysmographic Sensors", IEEE Transactions On Biomedical Engineering, Vol. 48, No. 7, July 2001, pp. 795-805).

However, to bring the sensor net into even wider practical use, it is essential that an electronic circuit having power supply of a radio communication function, a sensor, and a battery, etc. (hereinafter abbreviated as "sensor node") is in a maintenance-free state for a long time and sensor data is being transmitted and the external dimension thereof is reduced. For this reason, the development is in progress to provide an ultra-miniature sensor node that can be mounted anywhere. At the present stage, it has been contemplated that the sensor node, which is practically available for about one year without exchanging its battery, is required from the viewpoint of both of its maintenance and usability.

As described above, the sensor node is required to be very small and, concurrently, to be operable with low power consumption. For example, Non-Patent Document 2 (Crossbow, "Smarter Sensors In Silicon" (online) (Retrieved on Feb. 16, 2004), Internet (URL: http://www.xbow.com/Support/Support_pdf_files/Motetraining/Hardware.pdf) describes a prototype of a small sensor node called "Mica2Dot" having a diameter of about 3 cm. The Mica2Dot is configured of an RF chip having an integrated functionality necessary for radio communication and a low-power-consumption processor chip. This prototype performs an intermittent operation in such a manner that the prototype is held in a standby mode for 99% of operation time, and is intermittently activated only for remaining 1% of the operation time and wirelessly communicates the result, whereby the operation can be performed for about one year with a small battery. This sensor node performs the radio communication by using, for example, frequency bands ranged from 260 to 470 MHz and 902 to 928 MHz, etc. which are usable without a license in the United States. In general, to perform radio communication, a specific transmitter/receiver device preliminarily licensed or authorized must be used, so that use is greatly restricted. Under such circumstances, since a license-free frequency is used, the device can be mounted without using much labor and cost and the system construction becomes easy, so that it is advantageous to use the above-mentioned frequency bands. Particularly, in the United States, the maximum values of transmission power are regulated as being 11 mV/m or lower in a band of 433 MHz and 50 mV/m or lower in 900 MHz (at a distance of 3 m from a transmission point in any of the cases), wherein even in the license-free frequency bands, when the above-mentioned frequency bands for which the limit values are relatively reduced are used, excellent communication performance and low costs are implemented.

Nevertheless, however, radio wave regulations differ depending on the nation, location, and the like. For example, in Japan, the radio wave regulations are described in Non-Patent Document 3 ("Popularly Used Micro-force Radio Devices" (online) (Retrieved on Feb. 17, 2004), Internet (URL: http://www.circuitdesign.jp/jp/technical/technical_pdf/bijaku.pdf.PDF), and tolerances of electrical field intensity for use in the license-free frequency bands are not necessarily alleviated.

Also, Non-Patent Document 4 ("Data Sheet CR2032" (online) (Retrieved on Feb. 21, 2004), Internet (URL: http://www.maxell.co.jp/e/products/industrial/battery/pdf/CR2032_Data Sheet.pdf) discloses a small button battery suitably usable as power source of the sensor node.

SUMMARY OF THE INVENTION

Radio resources (usable frequency bands and maximum transmission powers) indispensably necessary for radio communication differ depending on the nation and location. As shown in the Non-Patent Document 3, the license-free radio resources usable in Japan are as follows:

1. In a frequency band of 322 MHz or lower or 10 GHz and higher,
   an electrical field intensity of 500 µV/m and lower at a distance of 3 m from a transmission point; and
2. in frequency bands of 322 MHz and higher and 10 GHz or lower,
   an electrical field intensity of 35 µV/m and lower at a distance of 3 m from the transmission point.

The above limit values are significantly stricter than those in the United States. For this reason, to use a sensor node designed by contemplating high transmission power in a sever radio-restricted environment, the transmission power must be set lower than an initial set value. However, only power slightly lower than the power originally contemplated can be received on a reception side. For example, in the case where a sensor node designed under the radio restriction in the United States is used under the radio restriction in Japan, when the frequency band is 900 MHz, the transmission power must be reduced from 50 mV/m to 35 µV/m. That is, the radio intensity must be reduced by as much as 63 dB (=20×log (50 mV/0.035 mV)).

In an ordinary RF chip, the minimum reception sensitivity (minimum value of signal levels of receivable RF (radio frequency) signals) is about −100 dBm. When the radio intensity is reduced by as much as 63 dB, the chip becomes substantially non-receivable. More specifically, a chip capable of performing stable transmission and reception at a distance of several tens meters becomes incommunicable even at a distance of several meters. If the frequency to be used is modulated from 315 MHz, a radio intensity of 500

μV/m is tolerated, so that the state is somewhat improved. Even in this case, however, the radio intensity is deteriorated by as much as 40 dB (=20×log (50 mV/0.5 mV)), so that deterioration in the communicable distance is unavoidable.

A first measure to enhance the reception sensitivity is to improve the sensitivity of the RF chip. However, it is considered difficult to further improve the present level according to the present CMOS technology. Under these circumstances, a method is widely executed that improves the reception sensitivity by adding an external RF low noise amplifier (LNA). Theoretically, a communication distance of about 10 m is contemplated implementable if the received signal is amplified up to about 20 dB by adding such an amplifier.

However, a range of experiments having actually been conducted is proved insufficient. Ordinarily, in the sensor node, since the size is restricted, a processor chip and a RF chip need to be integrated in a very small area (several centimeter square). On the other hand, as is well known, if radio communication is carried out by slight high-frequency radio signal such as a sensor node, radiation noise from the processor chip becomes hindrance and thereby reception sensitivity cannot easily be improved. Ordinarily, in a digital circuit, signals are communicated with square waves. The square wave is configured of communication signals of various frequency components that include a signal in a frequency band very close to a signal component that is used in radio communication. On the other hand, in the RF chip, a very slight high-frequency radio signal (typically, on the order of μV or lower) is amplified and demodulated into desired data. Therefore, if even a slight part of a signal of the digital circuit flows into an input portion of the RF chip, the RF chip is disabled to normally demodulate the RF signal received from an antenna. Further, by input/output nonlinear characteristics of semiconductor devices used in an amplifier circuit LNA and a semiconductor device even if frequency components are completely different from each other at a glance, signals having new frequency components are combined and noise signals appear in a reception-target frequency band. Consequently, in the worst case, what is amplified by the amplifier circuit (LNA) added for improving the reception sensitivity may be caused by the radiation noise from the processor chip. Accordingly, a contrary problem of requirements for miniaturization and reception sensitivity improvement of the sensor node must be solved.

In addition, to adopting the amplifier LNA influences the power consumption and the battery life. Even in the case where the functionality of reducing the power consumption, in the manner that all of the amplifiers LNA are set to standby modes in the unused time, is provided to the amplifier LNA, a standby current of about 10 μA at maximum is consumed. In order that the sensor node is made maintenance-free, compact, and operable for a long time, a button battery is inevitably used. However, a current capacitance available with such a button battery is not larger than 200 mAh. For this reason, if it is assumed that a current of about 10 μA is always consumed by the amplifier LNA, the button battery is durable only about two years (2.28 years=200 mAh/0.01 mA/24 h/365 days) even with no operation being performed. Actually, the battery capacity is reduced depending on the condition. For example, the battery capacity is known to be reduced at a low temperature, whereby the reduction of the battery life is accelerated.

From the viewpoint of the battery life, what is important is how to use the battery. As is shown in Non-Patent Document 4, with the button battery, when a high current exceeding a current of several milliamperes is kept flowing, the battery capacity is significantly deteriorated. Further, as a result of examinations by the inventor, there has been found out the problem that even in the case where the button battery is used in a wave-pulse manner (intermittently), unless the peak current is suppressed, the battery capacity is significantly deteriorated. In actual measurement performed by the inventor, the same phenomenon as that in the above is observed even when a current of about 10 mA is consumed in a wave-pulse manner. For example, as is shown in Non-Patent Document 2, the conventional sensor node aims at a reduction in average current consumption and extension of the battery life by reducing, up to 1% or lower, a duty ratio (ratio between an actual operation time and an intermittent operation time interval during the intermittent operation). Therefore, the method of reducing the duty ratio and lowering the average consumption current has the problem of further decreasing the battery life.

For the RF chip implementable in the current semiconductor technologies, a current of about 10 mA is required for transmission and reception, and a current of about 5 mA is necessary for the operation of the low-power-consumption processor chip. Further, a current of 10 mA is necessary for the amplifier LNA. That is, totally a current of about 20 mA is necessary for the transmission and reception. For this reason, as disclosed in the Non-Patent Document 2, even if the operation is performed at a low duty ratio of about 0.1% and the apparent consumption current is reduced to about 10 μA, there is the problem that the battery life is considerably reduced due to the phenomenon of capacity deterioration of the button battery. Further, if the consumption current by the sensor is considered, the actual battery life is further reduced. The sensor in general applications of the sensor net includes a temperature sensor, an acceleration sensor, and an optical sensor, etc. The temperature sensor for several microamperes among these sensors is available. However, regarding in the optical-sensor based pulse sensor disclosed in the Non-Patent Document 1, a current of several milliamperes is required at its peak. Also, even if the consumption current of the temperature sensor is several microamperes, the current capacity of the button battery is limited in the case where the temperature sensor is always operated, so that an influence on the operational life is not negligible (even if the current is 5 μA, the battery does not last only for 4.5 years (=200 mAh/5 μA/24 h/365 days).

Therefore, an object of the present invention is to provide a small, long-life, and practical sensor node, which eliminates noise influence as much as possible to enhance more effective reception sensitivity by the amplifier LNA and whose peak current is suppressed to be lower while the standby current is suppressed as much as possible and in which the phenomenon of capacity deterioration of the button battery is reduced.

Another object of the present invention is to further provide a control method that totally controls a processor chip/RF chip/LNA/sensor in the sensor node to maximally prolong the battery life and thereby enables the standby current and the peak current to be minimized.

Representative one of the present inventions is as follows. An electronic device according to the present invention comprises: a board; a connector for connecting a sensor; a first signal processor circuit that receives input of sensor data from the sensor through the connector and forms transmission data; and a second signal processor circuit that converts a transmission signal from the first signal processor circuit into an RF signal, wherein the connector and the first signal processor circuit are mounted on a first surface of the board, and the second signal processor circuit is mounted on a second surface of the board. Thereby, a digital circuit and an RF circuit, which are noise-generating source, are isolated from each other. To enhance effects obtained therefrom, noise shield layers are provided to the board. Also, the respective surfaces are located such that the circuit, which is the noise-generating source, and a noise-sensitive circuit are spaced away from each other.

Also, the electronic device is configured to perform an intermittent operation and to enable power supply to be stopped for circuits not used therein. For example, a high-frequency low-noise amplifier LNA cuts off power supply in the case of performing no reception operation and blocks off provision of the power supply to the sensor in the case of performing no sensing operation.

Further, in an electronic device to which power supply is provided through a button battery and which is configured to be concurrently capable of performing an internal processing and a transmission/reception processing with an external device, the internal processing and the transmission/reception processing are executed with different timings in the case where it is determined that the sum of a consumption current required for the internal processing and a consumption current required for the transmission/reception processing exceeds a predetermined current amount, or are executed with overlapped timings in the case where the above-mentioned sum does not exceed the predetermined current amount. Although the button battery is a temporary battery, the battery life is deteriorated when a large peak current flows. Therefore, the operation timing is determined in accordance with an estimated consumption current.

The present invention has a practical communication-distance function and so allows the sensor node having practical operation life to be achieved.

BRIEF DESCRIPTION OF THE DRAWINGS

FIG. 9 is a view showing a signal flow of a sensor node SN1.

FIG. 10A is a view showing a configuration example of a power-off switch adaptable in the sensor node SN1.

FIG. 10B is a view showing a configuration example of a power-off switch adaptable in the sensor node SN1.

FIG. 10C is a view showing a configuration example of a power-off switch adaptable in the sensor node SN1.

FIG. 10D is a view showing a configuration example of a power-off switch adaptable in the sensor node. SN1.

FIG. 10E is a view showing a configuration example of a power-off switch adaptable in the sensor node SN1.

FIG. 11 is a flow chart of a power control method for enabling a sensor node to be operated with low power consumption.

FIG. 17 is a view showing a configuration example of data transmitted from the sensor node of the present invention in the sensor net system shown in FIG. 16.

DESCRIPTION OF THE PREFERRED EMBODIMENTS

Figure 1:
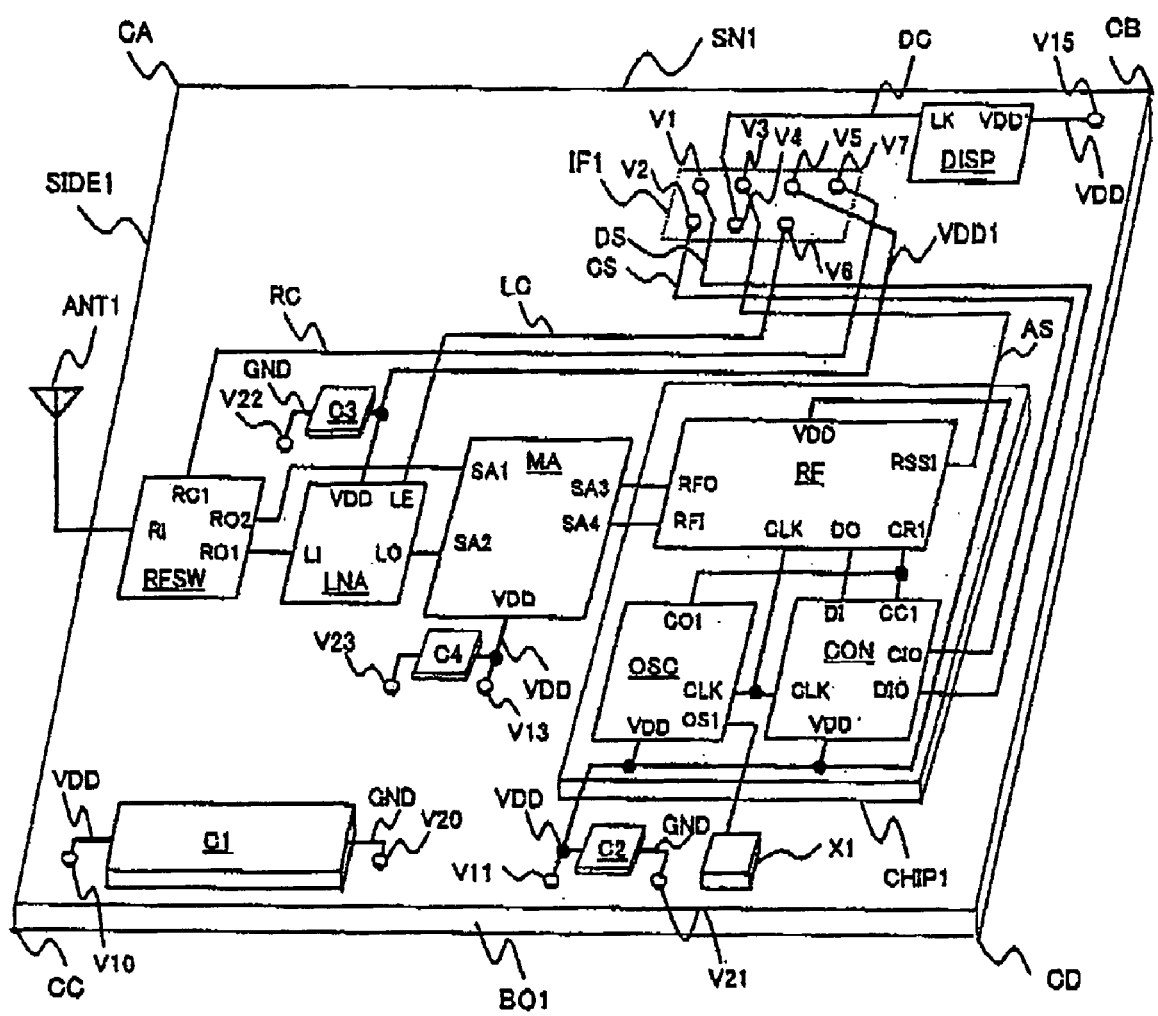
FIG. 1 is a view showing an embodiment (front side) of a sensor node.

Embodiments of the present invention will be described hereinafter with reference to the drawings. Note that components denoted by the same reference numeral indicate the same or similar configuration.

Figure 2:
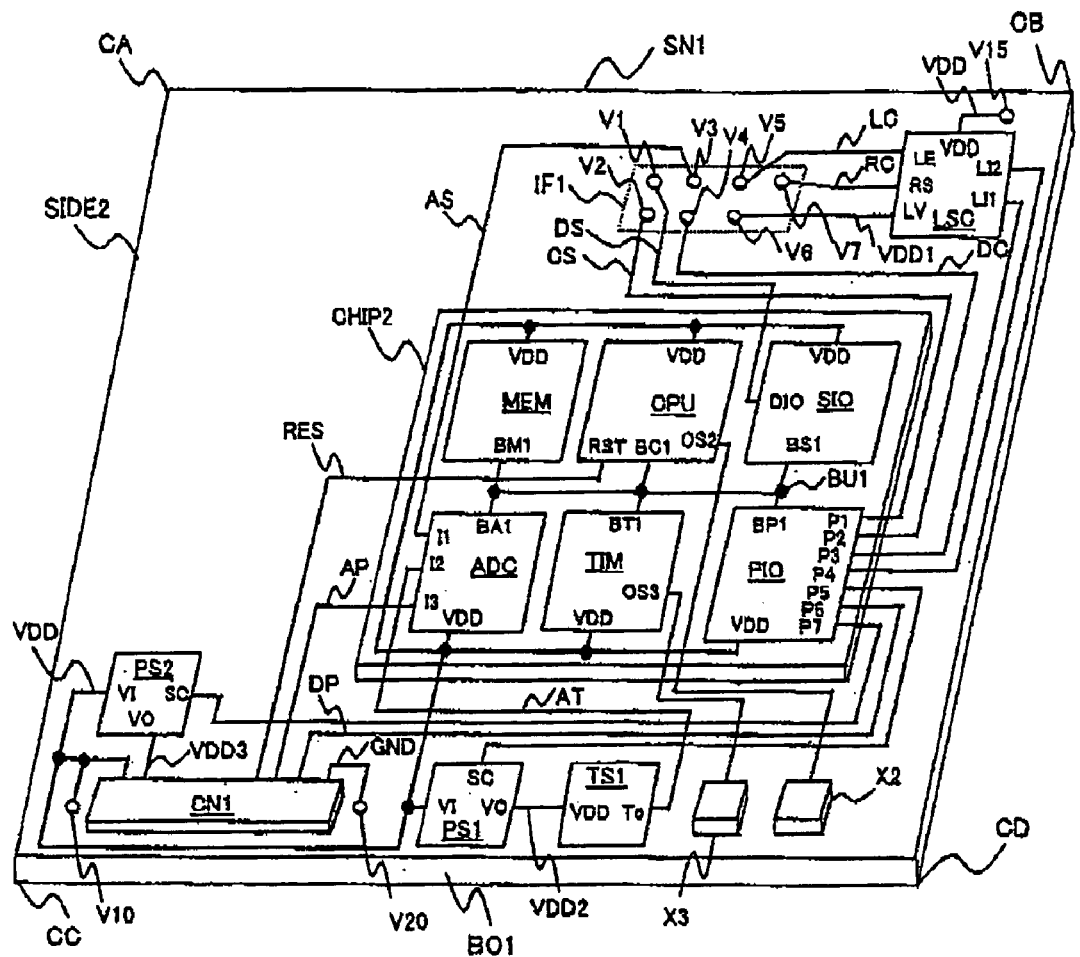
FIG. 2 is a view showing an embodiment (rear side) of the sensor node.

FIG. 1 shows a state where circuits constituting a sensor node SN1 are mounted on a front side (surface) SIDE1 of a board BO1; and FIG. 2 shows a state where the circuits constituting the sensor node SN1 are mounted on a rear side (surface) SIDE2. Referring to FIG. 1, mounted on the front side SIDE1 of the board BO1 are a high-frequency signal processor chip CHIP1 (hereinafter abbreviated as "RF chip"); a first crystal oscillator X1; a high-frequency switch RFSW; a high-frequency low-noise amplifier LNA; a matching circuit MA; an interface IF1 with the circuits mounted on the rear side SIDE2; a display device DISP; and capacitors C1, C2, C3, and C4. Also, with reference to FIG. 2, the rear side SIDE2 is configured of a processor chip CHIP2; a connector CN1; first and second power-off switches PS1 and PS2; a temperature sensor TS1 serving as an internal sensor; second and third crystal oscillators X2 and X3; and an RFSW/LNA control circuit LSC that controls, through the interface IF1, the switch RFSW and the amplifier LNA provided on the front side SIDE1. The connector CN1 is coupled to an external sensor (not shown). Note the crystal oscillators X1 to X3 may be replaced by ceramic oscillators.

The RF chip CHIP1 and the processor chip CHIP2 are coupled to each other through the interface IF1. From the internal sensor or through the connector CN1, the processor chip CHIP2 collects sensor data from the external sensors and delivers the data to the RF chip CHIP1 through the interface IF1. The RF chip CHIP1 converts collected sensor data into a radio signal and transmits the signal to an external radio terminal situated outside of the sensor node SN1. In addition, the RF chip CHIP1 conversely receives a radio signal from the external radio terminal. Typically, the external radio terminal transmits, for example, a transmission request for sensor data and operational parameters representing a frequency and a transfer rate of radio communication, etc. The data thus received in the sensor node SN1 is delivered to the processor chip CHIP2 through the interface IF1, and is used in, for example, a setup operation in subsequent radio communication.

Figure 3:
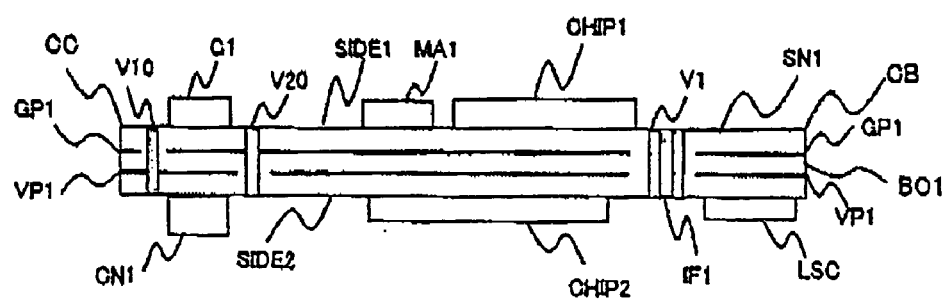
FIG. 3 is a view showing an embodiment (cross section) of the sensor node.
Figure 4:
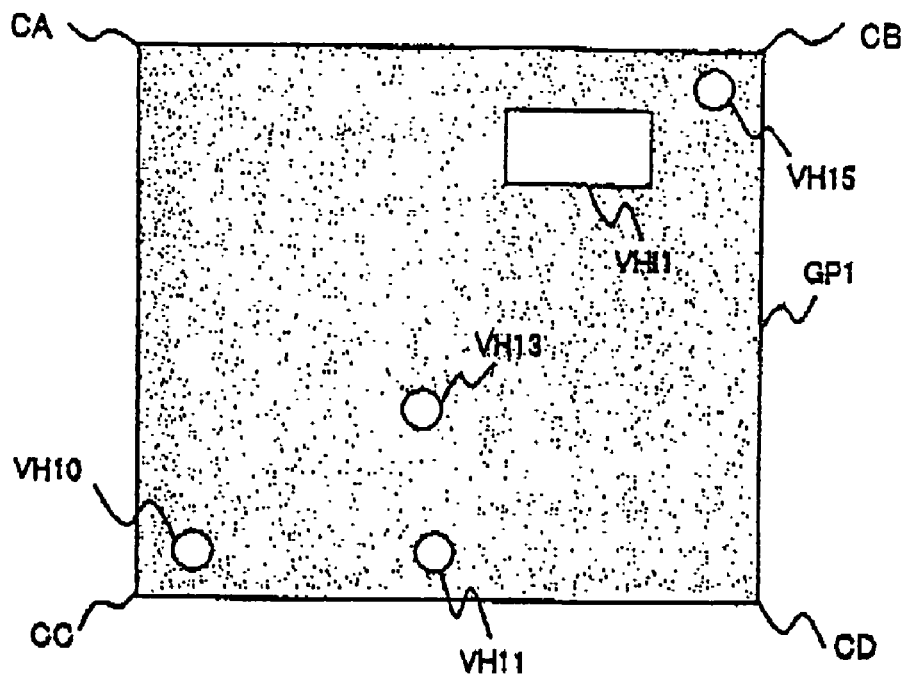
FIG. 4 is a view showing a ground plane layer provided inside a board.
Figure 5:
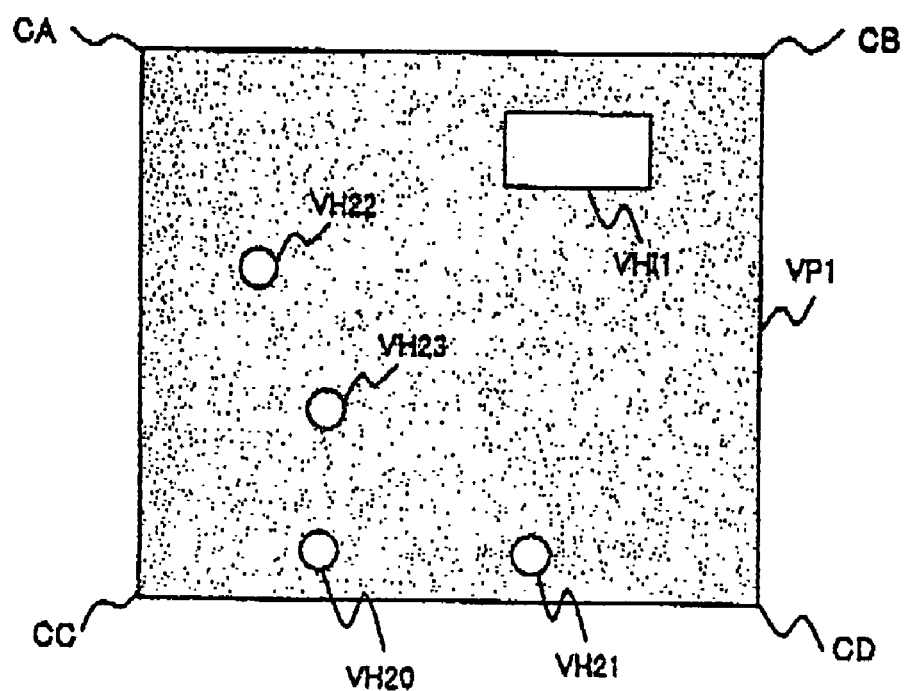
FIG. 5 is a view showing a power-supply plane layer provided inside the board.

FIG. 3 shows a cross-sectional view of the sensor node SN1. As shown in this figure, inside the board BO1 are provided a ground plane GP1 and a power-supply plane VP1. The two planes are used as front and rear shields of the board BO1, and serve to improve effective reception sensitivity by reducing noise generated from, for example, the processor chip CHIP2 etc. transferred to high-frequency circuits mounted on the front side SIDE1. The ground plane GP1 is coupled to a via (e.g., via V20) connected to a ground potential GND (reference potential), whereby the ground potential GND is supplied thereto. Also, the power-supply plane VP1 is coupled to a via (e.g., via V10) connected to a power line VDD, whereby the power-supply potential VDD is supplied thereto. FIGS. 4 and 5 are views showing, respectively, plan configurations of the respective ground plane GP1 and the power-supply plane VP1. In the ground plane GP1, portions other than the vias, which are allowed to be connected to the ground (e.g., via V20) are not disposed on the plane layer so that the portions do not contact with the vias. The portions correspond to, for example, via-holes VH10 to VH15 for passing the vias and the interface IF1. Similarly, in the power-supply plane VP1, a plane is not provided to peripheral portions of vias not coupled to the power-supply plane VP1 (FIG. 5).

Note that, in FIG. 3, of two plane layers, a plane layer closer to the RF chip CHIP1 is used as the ground plane GP1. This configuration is preferable for the reason that power-supply impedance of the ground plane GP1 as viewed from the high-frequency circuits on the front side SIDE1 can be reduced. Also, in the examples shown in FIGS. 4 and 5, although the plane layer is formed on the overall surface except for via holes, it may be partly used as a wiring layer of the rear side SIDE2 or the front side SIDE1.

Next, the processor chip CHIP2 mounted on the rear side SIDE2 of the board BO1 will be described with reference to FIG. 2. The processor chip CHIP2 includes a memory circuit MEM, a processor circuit CPU, a data input/output circuit SIO, an A/D converter circuit ADC, a timing generator circuit TIM, and a programmable I/O circuit PIO. These circuit blocks are coupled to one another through an internal bus BU1, wherein exchange and control of data are executed.

The memory circuit MEM is configured of a nonvolatile memory, such as a low-power-consumption SRAM (static random access memory) or a flash memory. Software for implementing a control method specific to the present invention, as described below, is mounted on the memory circuit MEM. In accordance with the mounted software, the processor circuit CPU controls other circuit blocks of the processor chip CHIP2 to implement desired operations.

The data input/output circuit SIO handles serial data, and is used to send sensor data the RF chip CHIP1. The programmable I/O circuit PIO handles parallel data, and is used to perform input/output of control data necessary for operation modes such as those primarily on, for example, transmission and reception, in the RF chip CHIP1.

The external sensor is connected to the connector CN1. The external sensor may be any of an analog sensor for outputting analog data and a digital sensor for outputting digital data. Sensor data AP of the analog sensor is converted by the A/D converter circuit ADC into digital data. For example, an analog temperature sensor TS1 is built in the board BO1 of the sensor node SN1, and temperature data AT from the sensor TS1 is converted into a digital quantity, and the digital data (digital quantity) is stored into the memory circuit MEM as occasion demands. On the other hand, sensor data DP of the digital sensor is inputted to the processor chip CHIP2 through the programmable I/O circuit PIO, and is stored in the memory circuit MEM as occasion demands.

The processor chip CHIP2 controls the RFSW/LNA control circuit LSC, thereby executing, for example, on/off switching of the power for the amplifier LNA and transmission/reception switching of the RF switch RFSW. In addition, the processor chip CHIP2 controls the power-off switches PS1 and PS2, thereby controlling the on/off switching of the power for temperature sensor TS1, the gas sensor, and the like. The timing generator circuit TIM generates, for example, timing necessary for operation in the form of, for example, clock signals, and timer signals for use in intermittent operation as described below.

Note that the processor chip CHIP2 selectively uses two crystal oscillators to perform low-power-consumption operation. The crystal oscillator X2 is provided for a main clock, and is of, for example, several MHz's or higher. Typically, a consumption current during the use of the main clock is several milliamperes. Meanwhile, the crystal oscillator X3 is provided for generating sub-clocks and timer signals, and is configured of, for example, an oscillator of 32-KHz ultra-low consumption current type used for wristwatches. In the processor chip CHIP2, in a low power consumption mode, the main clock X2 is stopped and the processor chip is driven with the sub-clock X3, thereby enabling the consumption current to be reduced to 10 μA or less. In addition, of the circuit blocks, the A/D converter circuit ADC, the data input/output circuit SIO, the programmable I/O circuit PIO, and the memory circuit MEM reducing the consumption current at a standby time enable implementing a standby current of several microamperes or less in the manner that the clock supply is stopped in accordance with the control of the processor circuit CPU.

The RF chip CHIP1 mounted on the front side SIDE1 of the board BO1 will be described hereinafter with reference to FIG. 1. The RF chip CHIP1 is configured of a high-frequency modem RF, an oscillator circuit OSC, and a control circuit CON. Sensor data DS sent from the processor chip CHIP2 is converted by a high-frequency radio signal RFO in a predetermined frequency band (ranged to 315 MHz) and transmitted to the external radio terminal. A high-frequency radio signal sent from the external radio terminal is received by an antenna ANT1 and is demodulated by the high-frequency modem RF. A demodulated signal CS is delivered to the processor chip CHIP2 through the interface IF1. The reception intensity is monitored in the sensor node SN1, and also a signal AS indicative of the reception intensity is delivered from an RSSI terminal of the high-frequency modem RF to the processor chip CHIP2 through the interface IF1.

In accordance with an oscillatory frequency of the oscillator circuit OSC, the oscillator circuit OSC generates clock signals necessary for the entirety of the RF chip CHIP1 and RF signals (carrier frequency signals) in desired radio communication bands.

In addition, the high-frequency modem RF and the oscillator circuit OSC are controlled by the control circuit CON in accordance with the control signal CS. More specifically, control is performed for switching of operation modes of operations such as transmission and reception, fine adjustment of the frequency band of a transmission/reception signal, or the transmission power. In addition, the entirety of the RF chip CHIP1 can be shifted to the standby mode by a control signal sent from the processor chip CHIP2. In this case, typically, the consumption current if the RF chip CHIP1 can be reduced down to a 1 μA or less.

The following will describe operations and configurations of other configuration elements.

The high-frequency switch RFSW is controlled by an RFSW/LNA control circuit provided on the rear side SIDE2. Connections between the antenna ANT1 and the RF chip CHIP1 are changed to implement desired transmission and reception operations. More specifically, at the time of transmission, a terminal R1 and a terminal R02 of the high-frequency switch RFSW are brought into communication with each other. At the time of reception, the terminal R1 and a terminal RO1 of the high-frequency switch RFSW are brought into communication with each other.

As an external device of the RF chip CHIP1, the amplifier LNA amplifies a very low-level high-frequency radio signal received by the antenna ANT1 to a maximum demodulatable level in the RF chip CHIP1. The amplifier LNA is provided as an external circuit for the reason that a device formed by a process different from the process for forming the RF chip CHIP1. For cost reduction and low-power-consumption operation, the RF chip CHIP1 is preferably configured of a CMOS circuit. On the other hand, however, the CMOS circuit has the problem that high gate noise is produced and is not sufficiently capable of amplifying a low-level high-frequency radio signal. For this reason, a circuit formed by a process different from a CMOS-compatible process is used for the amplifier LNA, and is provided as the external circuit. By taking amplifying ability into account, the amplifier LNA is preferably formed of, for example, a compound semiconductor such as a GaAs semiconductor, SiGe, or bipolar circuit. The high-frequency radio signal received by the antenna ANT1 is input to an input terminal LI of the amplifier LNA and is output via an output terminal LO after being amplified at a predetermined amplification factor. When communication is desired to be steadily performed at a communication distance of about 10 m in a 315 MHz band, the amplification factor of the amplifier LNA is preferably about 10 to about 20 dB. In addition, the current consumption of an amplifier is generally high, an enable terminal LE is controlled to switch between the operation mode and the standby mode, and the standby-time consumption current can be typically reduced to about 10 µA. Nevertheless, however, in the case where the consumption current is always as large as 10 µA, the event imposes a serious influence on the battery life. Therefore, the present embodiment is configured such that power supply to the amplifier LNA is cut off in accordance with a control signal from the processor chip CHIP2, whereby implementing low power consumption of the sensor node SN1.

The matching circuit MA causes input/output impedance of the RF chip CHIP1 with input/output impedances of the RF switch RFSW and the amplifier LNA, whereby enabling the high-frequency radio signal to be communicated without loss between these devices. The matching circuit MA is configured of passive components, such as an inductor, capacitor, resistor, and filter.

Figure 6:
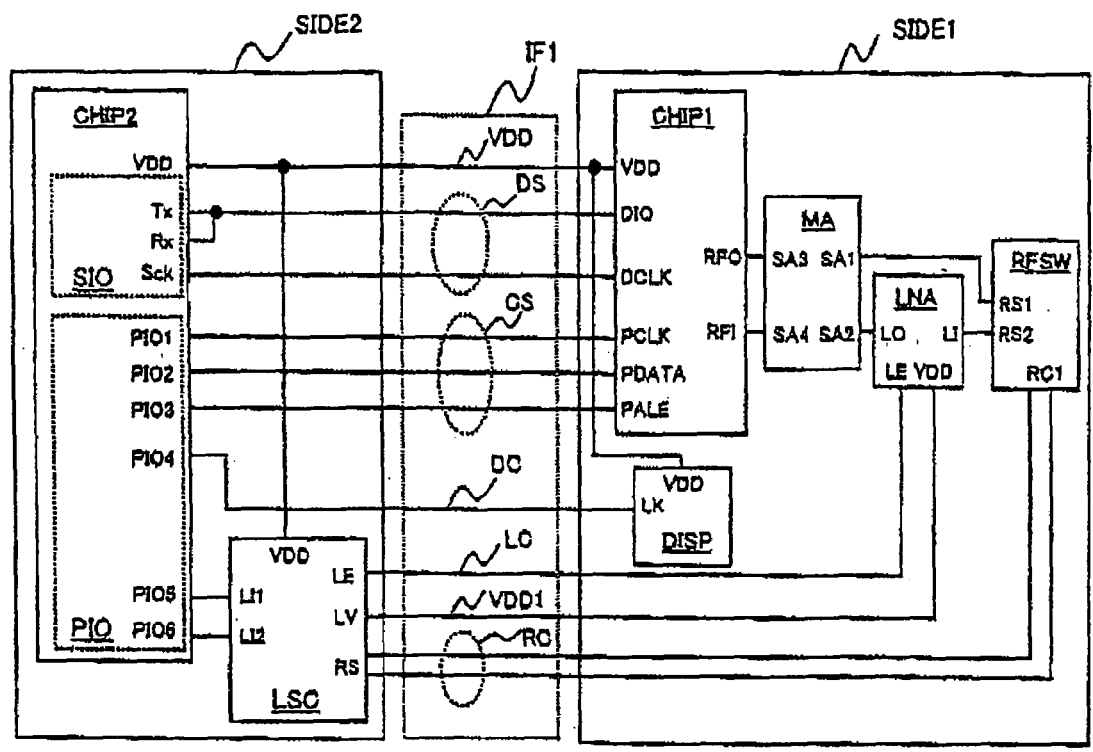
FIG. 6 is a view showing the detail of an interface IF1.

FIG. 6 is a view showing a state where circuits mounted on the front side SIDE1 and circuits mounted on the rear side SIDE2 are connected via the interface IF1. The interface IF1 is configured of a data signal line DS, a control signal line CS, display-device (DISP) control line DC, an LNA enable terminal control line LC, an RFSW transmission/reception switching control line RC, and a power line VDD/LNA power line VDD1.

Figure 7:
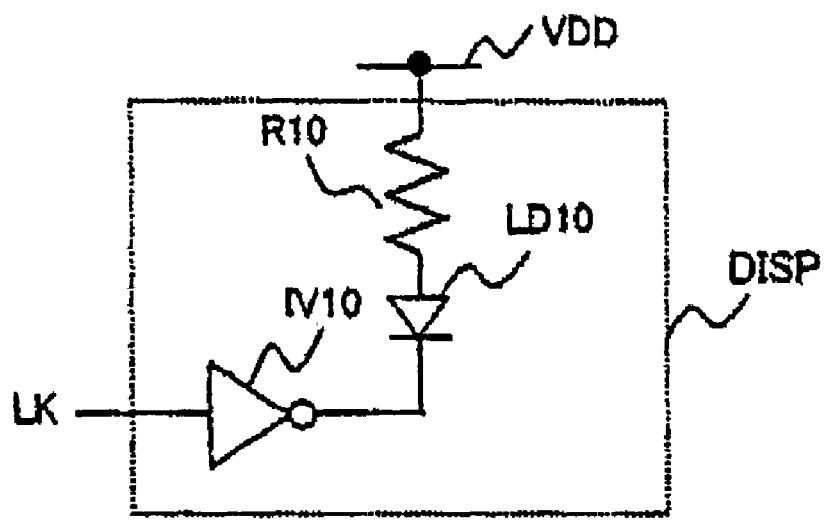
FIG. 7 is a view showing a configuration example of a LED display monitor.

The data signal line DS is a signal line connecting between the data input/output circuit SIO of the processor chip CHIP2 and the high-frequency modem RF of the RF chip CHIP1. The control signal line CS is a signal line connecting between the programmable I/O circuit PIO of the processor chip CHIP2 and the control circuit CON of the processor chip CHIP2. The data signal line DS is used for data communication between the two chips, and the control signal line CS is used as a control line for the processor chip CHIP2 to switching between operation modes of the RF chip CHIP1. The display-device control line DC is used to control the display device DISP. FIG. 7 shows an example configuration of the display device DISP. The display device DISP is configured of a light-emitting diode (LED) LD10 (LED), an inverter IV10 for driving the LED LD10, and a resistor R10 for restricting the current of the LED LD10. The display device DISP is lit (turned ON) when, for example, radio communication with an external radio terminal is successful at a setup time or when an abnormal state such as failure has occurred, and ON/OFF thereof is controlled.

Figure 8:
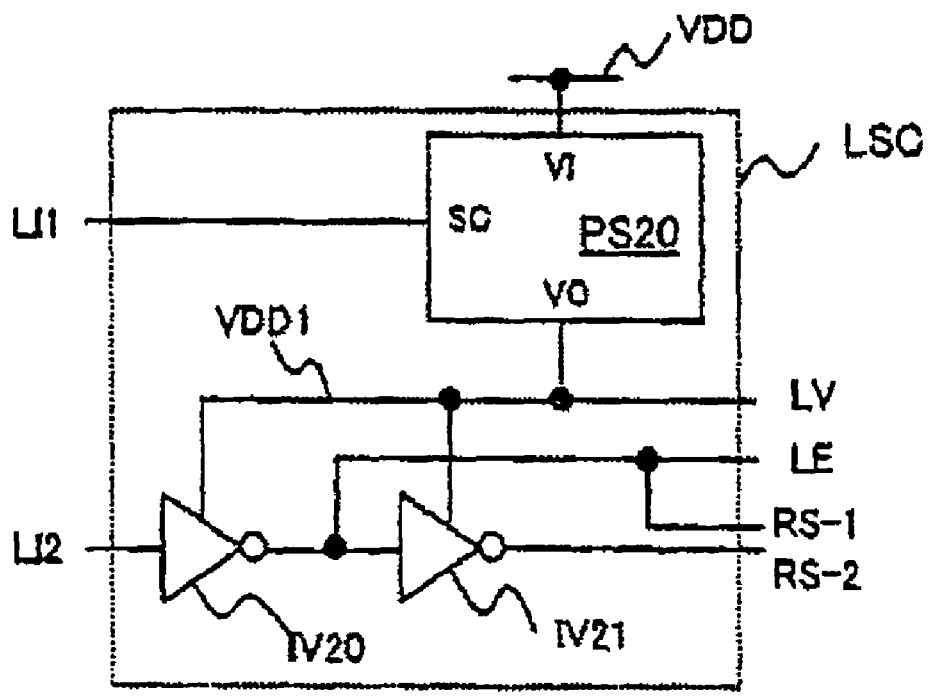
FIG. 8 is a view showing a configuration example of a control circuit for a high-frequency switch and an amplifier LNA.

The LNA enable terminal control line LC, the RFSW transmission/reception switching control line RC, and the LNA power line VDD1 is controlled by the RFSW/LNA control circuit LSC. FIG. 8 shows an example configuration of the control circuit LSC. Two input terminals LI1 and LI2 of the RFSW/LNA control circuit LSC are controlled by a signal that is output from the programmable I/O circuit PIO of the processor chip CHIP2. When activating the amplifier LNA, LI1 is set to "0" and sets a power-off switch PS20 to a communicative state, thereby energizing the power line VDD1 of the amplifier LNA. In this case, when the LI2 is set to "1", the enable terminal LE is set to "0", thereby activating the amplifier LNA. Concurrently, an RFSW control line RS-1 having the same level as the LNA enable terminal LE is set to "0", and an RFSW control line RS-2 is set by an inverter IV21 to "1", whereby the RF switch RFSW sets a reception path to be energized and shuts a transmission path. On the other hand, when the LI2 is set to "0", the amplifier INA is deactivated, whereby the high-frequency switch RFSW sets the transmission path to be energized and shuts the reception path.

Features of the present embodiment are summarized as follows.

(1) The high-frequency circuits handling the low-level high-frequency radio signals and other portions, i.e., digital circuits are isolated by being separately provided on the front side and rear side of the board BO1, whereby the noise influence is reduced to improve the reception sensitivity. As described in connection with the related art, strict restriction is imposed on the maximum transmission power during the use of the sensor node in some times. In this case, only with an RF chip, the reception sensitivity is insufficient, so that the reception sensitivity must be compensated for by the low-noise high-frequency amplifier LNA. However, even with the amplifier added, a received signal desired to be amplified cannot be amplified unless the noise flow-in from the digital portions is minimized. In this case, a most effective measure is to isolate the RF portions and the digital portions in distance. However, for the sensor node, the size, particularly, the surface area is preferably minimized, so that it is not preferable to increase the surfaces in order to increase the distance between the RF circuit and the digital circuit.

In view of the above description, the high-frequency circuit and the digital circuit are isolated by being separately provided on the front side and rear side of the board, and the ground plane, which is effective for shielding noise signals, and the power-supply plane are provided inside the board. Firstly, noise from the digital circuit is shielded, whereby the flow-in of noise to the RF portion can be suppressed as much as possible. In addition, with the power-supply plane being provided immediately below the ground plane, electrostatic capacity can be imparted to portions between the power-supply plane and the ground plane. The electrostatic capacity is used as an effective bypass condenser to absorb noise that can flow into the power-supply circuit from the digital circuit. With the electrostatic capacity, noise that can flow from the digital circuit to the RF circuits via the power-supply circuit can be reduced as much as possible. Particularly, the impedance of the power-supply portion can be reduced in the manner that the power-supply plane, the ground plane, and the like are expanded over the surface as large as possible. Consequently, even when the noise somewhat flows from the digital circuit to the RF circuits, the voltage amplitude of the noise component can be reduced since the power-supply impedance is reduced. This is because the noise voltage is expressed by the product of the flew-in noise current and the power-supply impedance. According to the above arrangement, even when the noise somewhat flows from the digital circuit to the RF circuit, the noise can be restrained to a level lower level whereat the RF circuit is malfunctioned or the small RF signal from the antenna is masked.

In the present embodiment, in the case where the components are mounted with high density on both the front and rear sides of the board, not only the mounting surfaces are simply isolated, but also layout positions on individual mounting faces are devised. As shown in FIGS. 1 and 2, in the configuration of the present embodiment, even among the RF circuits, portions handling the low-level high-frequency radio signals are disposed as far as possible from circuits in which digital signals are frequently transition between "0"/"1" and causes a large amount of noise. FIG. 9 is a view used for easily understanding the configuration.

With reference to FIG. 9, a low-level high-frequency radio signal RFS1 received by the antenna ANT1 is inputted to the high-frequency switch RFSW. An high-frequency radio signal RFS2 selected by the high-frequency switch RFSW and somewhat attenuated is inputted to the amplifier LNA and amplified at a predetermined amplification factor. An amplified high-frequency radio signal RFS3 is led guided by the matching circuit, and an high-frequency radio signal RFS4 impedance-matched is inputted to the RF chip CHIP1. In the RF chip CHIP1, the high-frequency radio signal RFS4 is demodulated into a digital signal DJS1, and the digital signal is then taken into the processor chip CHIP2.

In general, in a radio communication facility such as a radio LAN, a connector for performing communication through digital signals is used to communicate the digital signals with a personal computer proper. That is, through the connector, signals transited between "0" and "1", that is, high rate digital signals are communicated. Therefore, there is the case where a connector is isolated in distance from an antenna. In comparison, however, in the sensor node SN1 according to the present embodiment, a signal DJP1 communicated between the connector CN1 and the RF chip is a digital signal that is very slow in transition or a digital signal slower than the clock signal of the processor chip CHIP2. For this reason, in the present embodiment, the connector CN1 is disposed in a position close to a signal path between the antenna ANT1 and the RF chip CHIP1. Concurrently, the processor chip CHIP2 is disposed in a position at a distance longer than the signal path between the antenna ANT1 and the RP chip CHIP1. In other words, the connector CN1 is disposed in the manner that the distance between the connector CN1 and the RF chip CHIP1 is longer than the distance between the processor chip CHIP2 and the RF chip CHIP1. As described above, in the component layout shown in FIG. 9, flow of signals specific to the sensor node is well handled, and both size reduction (miniaturization) and reception sensitivity can be simultaneously implemented.

(2) The power-off switch (see FIGS. 1, 2, and 8) is inserted into the power line for the high-frequency low-noise amplifier LNA to reduce the standby-time consumption current. Generally, the high-frequency low-noise amplifier LNA operates with high power consumption, and consumes a current of about 10 µA even in the standby time. The current value is excessively high for a sensor node incapable of obtaining sufficient power because of restrictions in size, usage, and the like. However, depending on the case, a practical communication distance cannot be accomplished without such an amplifier LNA.

For this reason, as shown in FIG. 8, the power-off switch PS20 is inserted a power line for the amplifier LNA, and the standby-time consumption current is reduced by the power-off switch PS20. As shown in FIGS. 10A to 10E, there are various types of usable power-off switches. For example, such switches are configured by: a P-MOSFET MP1 of FIG. 10A; a PNP bipolar transistor BP1 of FIG. 10B; an N-MOSFET MN1 of FIG. 10C; an NPN bipolar transistor BN1 of FIG. 10D; and one of FIG. 10E, which utilizes the output of the programmable I/O circuit PIO without modifications. In any of these types, when one of corresponding control terminals SC1 to SC5 is set to "1" or "0", the power supply to LNA can be out off. In reality, even when each of the switch devices MP1 to BN1 is OFF, a slight leak current flows. However, such a leak current during the OFF time in catalog value is on the order of 0.1 µA or less, so that the current may be considered not to substantially influence as the current.

At an operation time, a slight voltage drop occurs because of internal resistance of the switch devices MP1 to BN1. However, in the type of FIG. 10A, for example, the internal resistance when the switch device MP1 is turned ON can be made to about 5 Ω. As already described, the consumption current of the amplifier LNA at the operation time is about 10 mA, so that voltage drop caused by the switch device MP1 is about, 50 mA (=5 Ω×10 mA), which is a negligible value. Accordingly, it is assumed that a sufficient margin is available in the output drive capacity of the programmable I/O circuit PIO of the processor chip CHIP2, that is, when the current in a value larger than or equal to the value necessary during the operation time can be supplied. In this case, as shown in FIG. 10E, the power supply of the amplifier LNA would be drivable even with no switch device as shown in each of FIGS. 10A to 10D.

As described, in the present embodiment, when the amplifier LNA is not used (modes other than a reception mode), the power-off switch PS20 is shifted to the shut state (turned OFF). On the other hand, when the amplifier LNA is used (in a reception mode), the power-off switch PS20 is shifted to the communicable state (turned ON). In practice, even when the power-off switch PS20 has been shifted from OFF to ON, the operation needs to await until the internal circuit of the amplifier LNA stabilizes, for example, a wait time requires typically about 1 ms. Generally, however, the sensor node SN1 is designed on contemplation that the operation time thereof is quite long, for example, it is about 1% of the overall operation time according to the circumstances. Therefore, the increment in power consumption due to the wait time for switching to the reception mode can be neglected.

(3) Power-off switches (see FIG. 2) are inserted into the power lines of the sensors (internally and externally mounted), thereby restraining the standby-time consumption current. A principle similar to the second feature of the present embodiment is adapted to reduce the standby-time consumption current. By way of an example, as shown in FIG. 2, the power line VDD2 for the temperature sensor TS1 can be closed for connection when the temperature sensor TS1 is not used. At present, the temperature sensors of a low power consumption type (consumption current is about 5 µA) are in development. For the power-off switch PS1, even the type as shown in FIG. 10E is capable of supplying sufficiently the current required for the operation. The type of FIG. 10E does not require a discrete device, consequently enabling implementation without involving additional costs.

In addition, to reduce the consumption current of the external sensor, a power line VDD3 also is closed for connection by using the power-off switch PS2 (see FIG. 2). In general, the consumption current of an external sensor is larger either in the standby time or operation time than that the internal temperature sensor. For example, acceleration sensors include a type requiring a consumption current of about 1 mA. In addition, there are many oases where external sensors per se do not have the function of transition to the standby state. Therefore, it is anticipated that, with the button battery, an operational life longer than about one week (8.3 days=200 mAh/1 mA/24 h) cannot be obtained. Further, in the case where a phenomenon of battery capacity deterioration has occurred when discharged with a large current, it is anticipated that the battery capacity lasts for not more than several days. However, according to the configuration of the present embodiment, the power-off switches are used to perform power supply only when the sensors are used, and the power supply is closed when the sensors are not used. This enables the battery life to be significantly increased.

The configuration described above is effective even when the external sensor has caused failure for some reasons in a shorting mode. More specifically, in the case where a power-off processing of the power supply for the sensor is not performed, a large current quickly flows out of the battery and the battery is thereby depleted. In the present embodiment, however, the configuration is such that the power supply for the external sensor is normally held in the OFF state and the power supply is turned ON only when the sensor is used. Further, the power is supplied through the switch device constituting the power-off switch and the ON-resistance of the switch device works to reduce the shorting-time current as well. Concurrently, the shorting allows a large current flow by introducing voltage drop due to the internal resistance of the battery. Consequently, a bias voltage necessary for the switch device to maintain the ON state cannot be secured, whereby the power-off switch automatically returns to the OFF state.

During the above, the processor chip CHIP2 attempts to read an output value of the external sensor via the internal A/D converter circuit ADC. However, since the sensor is in the erase state, the processor chip CHIP2 cannot read a value other than an abnormal value sticking to the vicinity of a potential of "0". Therefore, if the arrangement is made such that control software mounted in the processor chip is imparted with the function of determining the above-described event to be abnormal and performing radio transmission of an abnormal signal, the case where the external sensor of the sensor node has caused an operational failure can be externally detected. Further, in this case, the arrangement can be made such that in the system having detected the abnormal signal, a control command for interrupting the use of the external sensor is issued, thereby allowing the continuation of the sensor node operation without using the external sensor in which the problem has occurred. Further, as described below in detail, when the sensor node with the failed external sensor can be identified in accordance with ID numbers stored in a memory MEM1 of the processor chip CHIP2, a countermeasure such as replacement can be taken.

The following describes in detail an operation of a power control method for preventing the phenomenon of battery capacity deterioration of the button battery due to the consumption current during the operation (see FIG. 11). In the sensor node, after setting the node and activating it (P100), when an initialization routine (P110) is executed, the operation immediately proceeds to a standby routine (P120). In the initialization routine P100, the operation sets an operation mode of the sensor node to a desired mode in accordance with a PDATA file. The PDATA file contains information such as operational parameters pre-stored in the nonvolatile memory portion of the memory circuit MEM of the processor chip CHIP2. More specifically, the PDATA file contains the pre-stored information, such as: timer intervals representing time intervals at which the standby mode is shifted to the operation mode; transmission rates for radio communication; frequency bands to be used; and ID numbers allocated with specific numbers in units of each sensor node. Further, pre-stored in the PDATA file are consumption current values of, for example, the amplifier LNA, the RF chip CHIP1, the processor chip CHIP2, and the external sensor, the values being used in an operation mode determination routine (P200) described below. In the initialization routine P110, the processor chip CHIP2 operates in the low-power-consumption mode, and also the main clock X2 of the RP chip CHIP1 and a clock X1 of the RF chip CHIP1 are set to OFF. In addition, the power supply to the sensors and the amplifier LNA is cut off.

In the standby routine P120, only the timing generator circuit TIM of the processor chip CHIP2 remains in the operation mode, whereby the operational portions are suppressed to the requisite minimum. Setting having thus been made enables reducing the standby-time operation current to several microamperes, typically, to 5 µA or less. When a timer interrupt takes place with a timer interval set in the initialization routine P110, the operation is shifted to a subsequent CPU activation routine (P130). In addition, when an interrupt line is connected to the connector CN1 (FIG. 2), the sensor node can be activated on demand by an interrupt from the outside.

The CPU activation routine P130 is executed to turn ON the main clock X2 of the processor chip CHIP2 and thereby activate the processor circuit CPU of the processor chip CHIP2. After the activation, the operation is shifted to an operation mode determining routine.

In the operation mode determining routine P200, a per-device consumption current value is read from the PDATA file described above in accordance with a parameter/command analysis subroutine (P220). In this case, the operation can read also a command, such as a sensor-data transmission request, which has been sent and received from an external radio terminal. For example, the command is a command to "activate the temperature sensor and transmit the result". Subsequently, in a consumption current estimating subroutine (P230), the operation estimates a consumption current necessary for execution in accordance with the command and parameter having been read. In a scheduler subroutine (P210), the operation determines activation methods of a subsequent sensing routine (P300) and a data transmission/reception routine (P400) so that a peak value of the consumption current is further reduced after a request from a base station has been satisfied.

Figure 12:
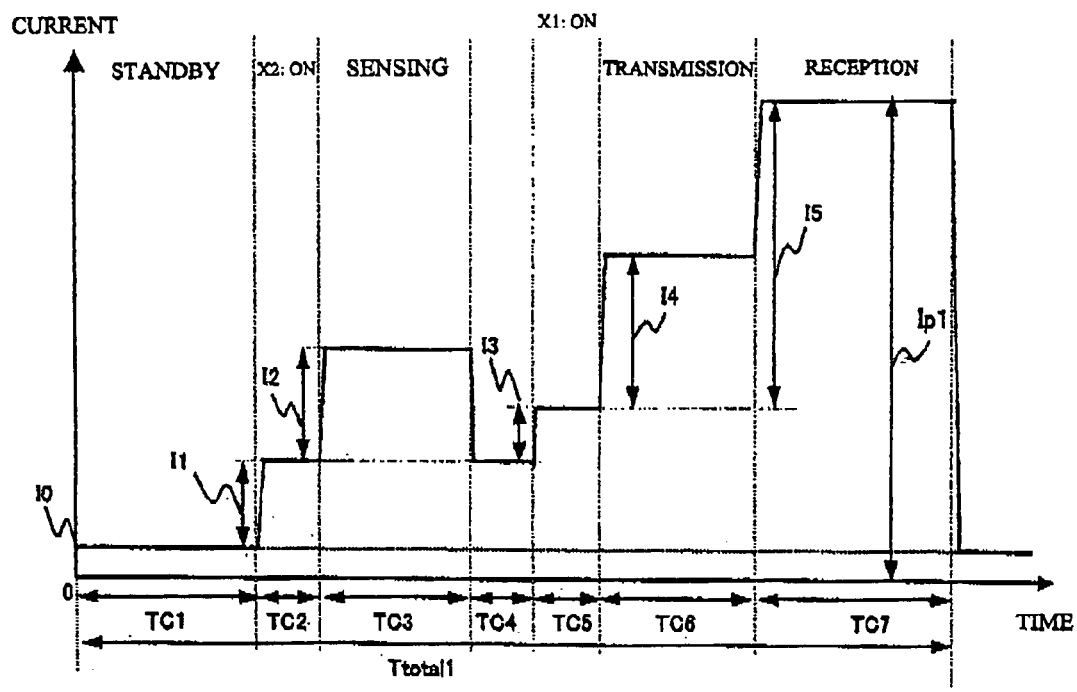
FIG. 12 is a view showing an example of a consumption current waveform in the sensor node when the power control method of FIG. 11 is applied.
Figure 13:
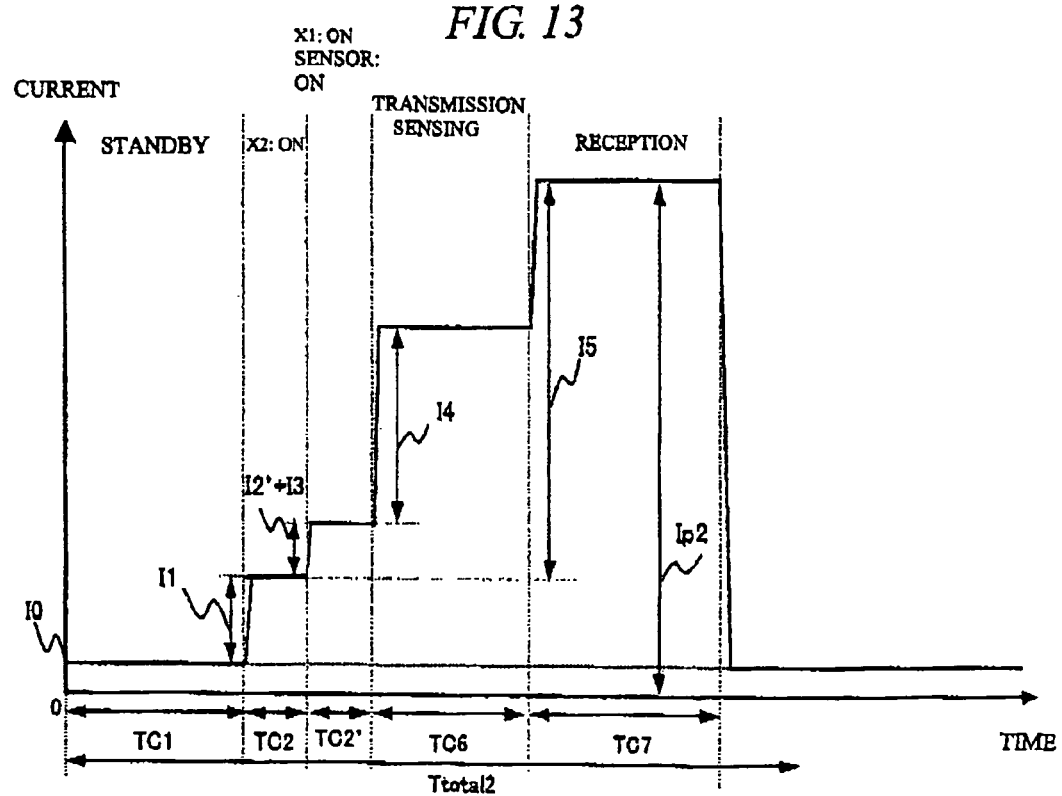
FIG. 13 is a view showing an example of a consumption current waveform in the sensor node when the power control method of FIG. 11 is applied.

For example, in the sensing routine P300, when the operation-time consumption current is several milliamperes and, when activating the external sensor non-negligible in comparison to the consumption current (10 mA to 20 mA) necessary for the data transmission/reception, the data transmission/reception routine P400 is not synchronously activated. Shown in FIG. 12 is a typical consumption current waveform of the sensor node in the above case. In the case where the sensor to be activated is a sensor such as the internal temperature sensor and does not consume a current larger than several microamperes, the data transmission/reception routine P400 is synchronously activated. Shown in FIG. 13 is a typical consumption current waveform corresponding to the above case. The power control described above enables reducing the peak value of the consumption current.

The operation of the sensing routine P300 is described hereinafter. At first, by an external/internal sensor determining subroutine (P310), the type of an activation-desired sensor is determined. Next, by a sensor power-supply activation subroutine (P320), if the type is an internal sensor, the PS1 is set to ON or if the type is an external sensor, the PS2 is set to ON. Subsequently, in a port-opening subroutine (P330), a port necessary to read a sensor result of an internal or external sensor is opened. For example, when reading the data of the temperature sensor TS1 shown in FIG. 2, the A/D converter circuit ADC of the processor chip CHIP2 is activated and an input terminal 12 of the ADC is set to a readable mode. On the other hand, if the activation-desired sensor is the internal sensor coupled to the connector CN1 shown in FIG. 2, a corresponding input terminal of the A/D converter circuit ADC or a corresponding input terminal of the programmable I/O circuit PIO is set to a desired operation mode. In this manner, the port is set to the data-readable mode. Then, in a sensor-data read/write subroutine (P340), the sensor data is actually read to the processor chip CHIP2 and stored into a file SDATA of the memory circuit MEM. When the desired sensor data has been written to the file SDATA according to the above-described steps, in a subsequent port-closing/ADC-off subroutine (P350), the operation shifts the used components such as the A/D converter circuit ADC and the programmable I/O circuit PIO, to a standby mode, and terminates the sensing routine P300.

Subsequently, the data transmission/reception routine P400 will be described below. Firstly, in a clock-X1-on subroutine (P410), the operation boosts the clock X1 of the RF chip CHIP1 and activates the RF chip CHIP1. At this time, activation of the RF chip CHIP1 by the processor chip CHIP2 is performed in the RF-chip regulated form via the control signal CS, as described above. Then, in accordance with a transmission/reception operating determination subroutine (P420), the operation determines which one of the transmission and reception operations is necessary. In this routine, for example, the sensor data is first transmitted to the base station, and the sensor node is then shifted to the reception mode. Staying in the reception mode, the sensor node awaits until a verification signal indicating that the sensor data has been received by the base station without error is returned. Control of the above-described sequence is executed by the routine (P420). The transmission and reception operations will be described below.

In the case of the transmission operation, in accordance with a subroutine P430, the high-frequency switch RFSW is shifted to a transmission mode. In addition, communication parameters such as a transmission rate and a frequency band to be used are sent to the RF chip CHIP1 via the control signal CS. Subsequently, in accordance with a subroutine P440, the sensor data is read from the file SDATA in the memory circuit MEM and is sent to the RF chip CHIP1 through the data signal line DS. Thereby, the sensor data is transmitted by means of radio communication to the outside.

In the case of the reception operation, in accordance with a subroutine P450, the communication parameters of, for example, the high-frequency switch RFSW and the RF chip CHIP1 are set, and the LNA power-off switch PS2 is set to a conductive state, and the enable terminal of the amplifier LNA is activated. Then, by a subroutine P460, the data is received and is written into the PDATA file as occasion demands.

Note that, although omitted in the above description for simplification, the activation of the amplifier LNA, the shifting of the RF switch RFSW, the activation of the clock X1 of the RF chip CHIP1, and the like in reality require times (typically, some hundreds μs to several milliseconds) until the individual components stabilize, so that waiting processings for the times are necessary for the individual routines operations. Similarly, the power-supply-off operation of the amplifier LNA, the clock-off operation of the RP chip CHIP1, and the like in reality require times until the individual components stabilize, so that wait-time processings are necessary.

Finally, upon receipt of an acceptance verification signal from the base station, in a subroutine P470, the operation terminates the clock X1, and returns the RF chip CHIP1 to the OFF state. Further, in a subroutine P140, the operation terminates the main clock X2 of the processor chip CHIP2, and then shifts to the standby routine P120.

Figure 14:
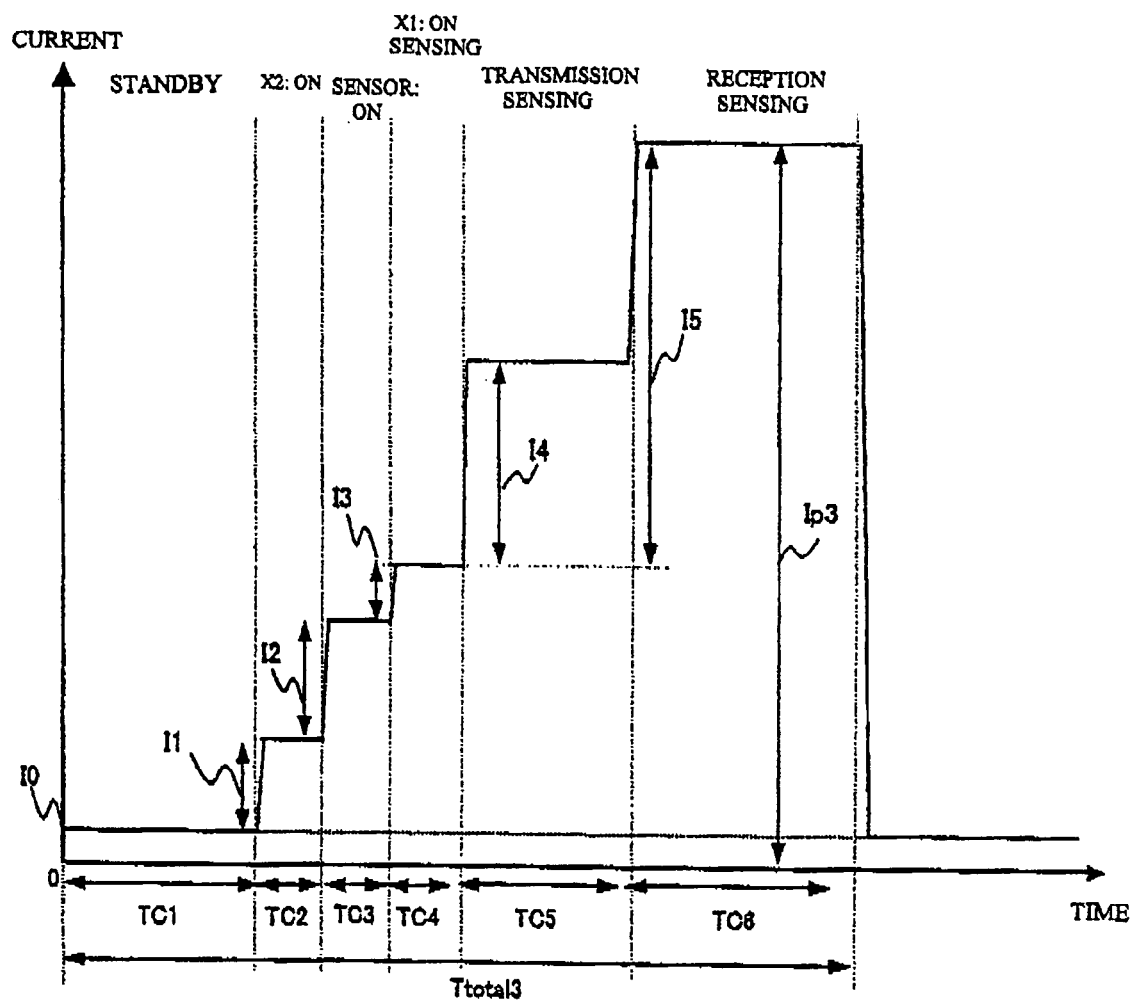
FIG. 14 is a view showing a comparative example of a consumption current waveform in the sensor node when the power control method of FIG. 11 is not applied.

As described above, according to the present embodiment, the necessary consumption currents are predetermined to select the method that does not cause the deterioration of the current capacity of the button battery. More specifically, in the case where a sensor consumes a current of as large as several milliamperes, when the data transmission/reception and the sensor are synchronously activated, a significant load that can seriously deteriorates the battery capacity is imposed on the button battery. Shown in FIG. 14 is a consumption current waveform in this case. A peak current (Ip3) represented by a value is a considerably larger than that in the case where the control method of the present invention is adapted (Ip3>Ip1). Meanwhile, clearly from the comparison between FIGS. 12 and 14, since the control method shown in FIG. 12 performs the data transmission/reception after the sensor activation, the time necessary to terminate the series of processes (Ttotal1>Ttotal3). In addition, the average current consumption in the FIG. 12 is somewhat larger than that shown in FIG. 14. However, in the case where a CR2032 button battery or the like is used as the power supply for the sensor node SN1, the consumption current usable in the range not causing the battery capacity deterioration is not larger than the current on the order of 0.1 mA. On the other hand, however, the operation of the sensor node requires the current of an order of 10 mA. However, when the button battery is used at the current value, there arises the problem that the electrode service life is significantly reduced. To prevent the problem, it is most effective to restrain the peak value of the consumption current, as far as we investigated. That is, to implement a long life operation with the button-battery operating sensor node, it is indispensably necessary to lower the peak value of the consumption current as much as possible. Accordingly, the control method of the present embodiment taking the characteristics of the button battery into consideration is relatively advantageous to enable a steady operation to be operated for a long time with the button battery.

In the case where the consumption current of the sensor is several microamperes, even when the data transmission/reception and the sensor are synchronously activated, the peak value of the consumption current almost does not change. More specifically, when the sensor is kept operated and the sensor data is transmitted while the sensor data is being read, the time required for the series of operations can be relatively much more saved. That is, since the operation can be shortly shifted to the standby mode, the method is relatively more capable of restraining the battery drain.

According to the current control method described above, the operation is available in view of the button battery characteristics and consequently the long life operation can be attained in the button battery operation.

Figure 15:
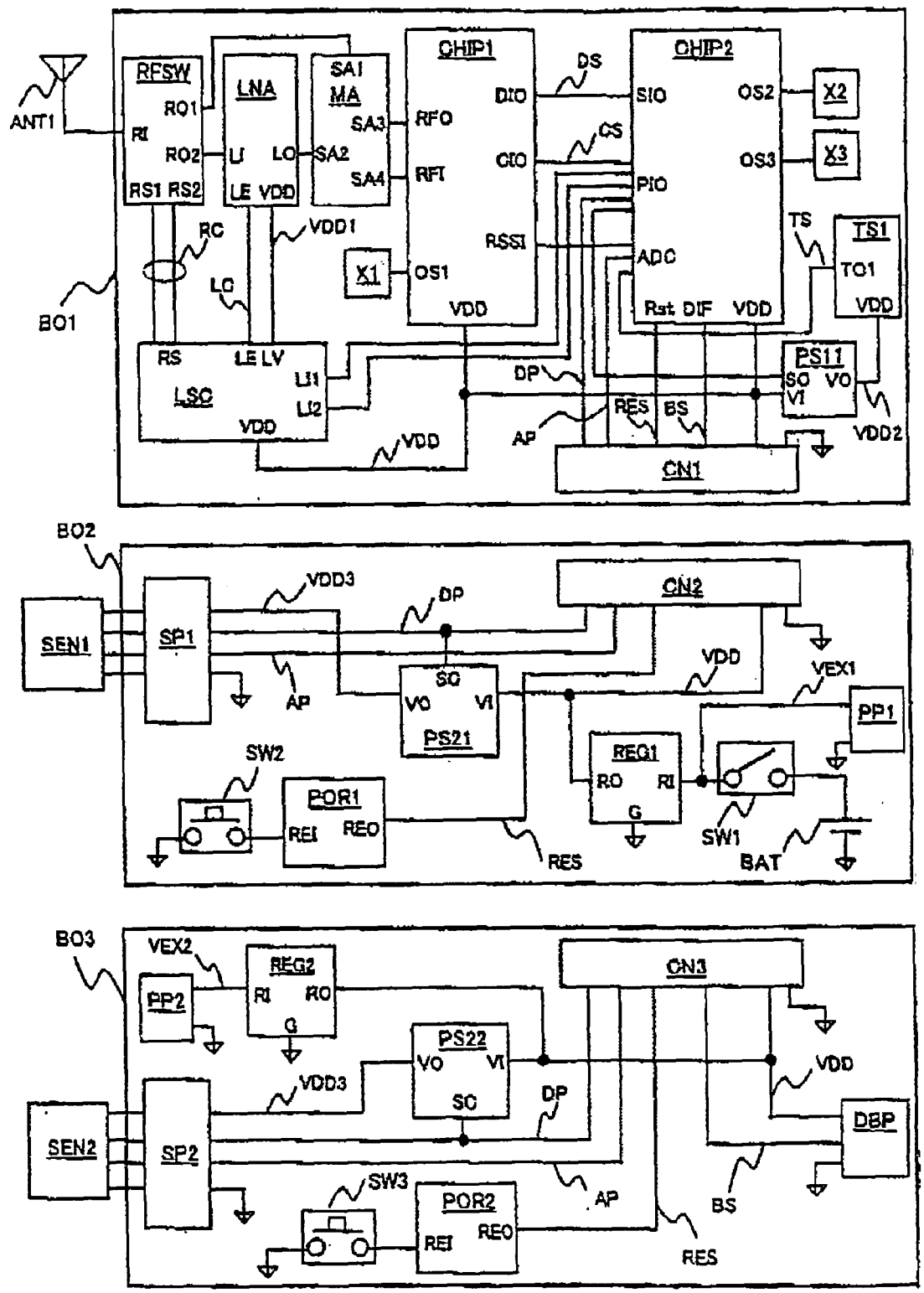
FIG. 15 is a view showing configuration examples of a power-supply board and a program written board that are used in combination with the sensor node of the present invention.

FIG. 15 shows an example in which a sensor node is configured of three boards. The sensor node is configured of a main-body board BO1, a power-supply board BO2, and a control-software written board BO3. In normal use, the sensor node is used in the form of combination of the main-body board BO1 and the power-supply board BO2. In the case of software rewriting, the sensor node is used in the form of combination of the main-body board BO1 and the control-software written board BO3. Of these boards, the configuration of the main-body board BO1 is similar to the sensor node SN1 already described above, so that description thereof will be omitted herefrom.

The power-supply board BO2 is configured of a connector CN2 for connection with the main-body board BO1; a dedicated sensor port SP1 for connecting an external sensor; a power-off switch PS21 for performing power-off processing of power supply for the dedicated sensor port SP1; a power-on reset circuit POR1; a manual reset switch SW2; an external power-supply connector PP1; a power-supply selection switch SW1; a button battery BAT1; and a regulator REG1. The power-supply board BO2 supplies the power from the internal button battery to the main-body board BO1 through the connector CN2. A signal line for reading data of the sensor is routed to the sensor port SP1, and the external sensor can be connected to the sensor port SP1.

The control-software written board BO3 is configured of a connector CN3 for connection with the main-body board BO1; a dedicated sensor port SP1 for connecting the external sensor; a power-off switch PS22 for performing power-off processing of power supply for the dedicated sensor port SP2; a power-on reset circuit POR2; a manual reset switch SW3; an external power-supply connector PP2; a regulator REG2, and a program rewriting port DBP. The board BO3 receives the power from an external power-supply connected to the external power-supply connector PP1, and supplies the power necessary for operation of the main-body board BO1. Further, through the program rewriting port DBP, the board BO3 performs rewriting of control software mounted on a processor chip of the main-body board BO1. Signal lines of the program rewriting port are connected to a program rewriting port through the connectors CN3 and CN1, and rewriting of the mounted control software is performed through the port.

The configuration in which the sensor node is thus formed on the separate boards has advantages as described below. For normal use, an unnecessary program rewriting port needs not be mounted on the main-body board BO1. Therefore, the size of the main-body board can be reduced. Conversely, an excessively small sensor node is not easy to be handled when performing software operation verification/debugging. However, according to the configuration formed as shown in FIG. 15, signal lines necessary for debugging can be led to the control-software written board with which the size does not become problematic. Therefore, the time and labor for debugging can be reduced, and the time necessary for development can be significantly reduced.

Figure 16:
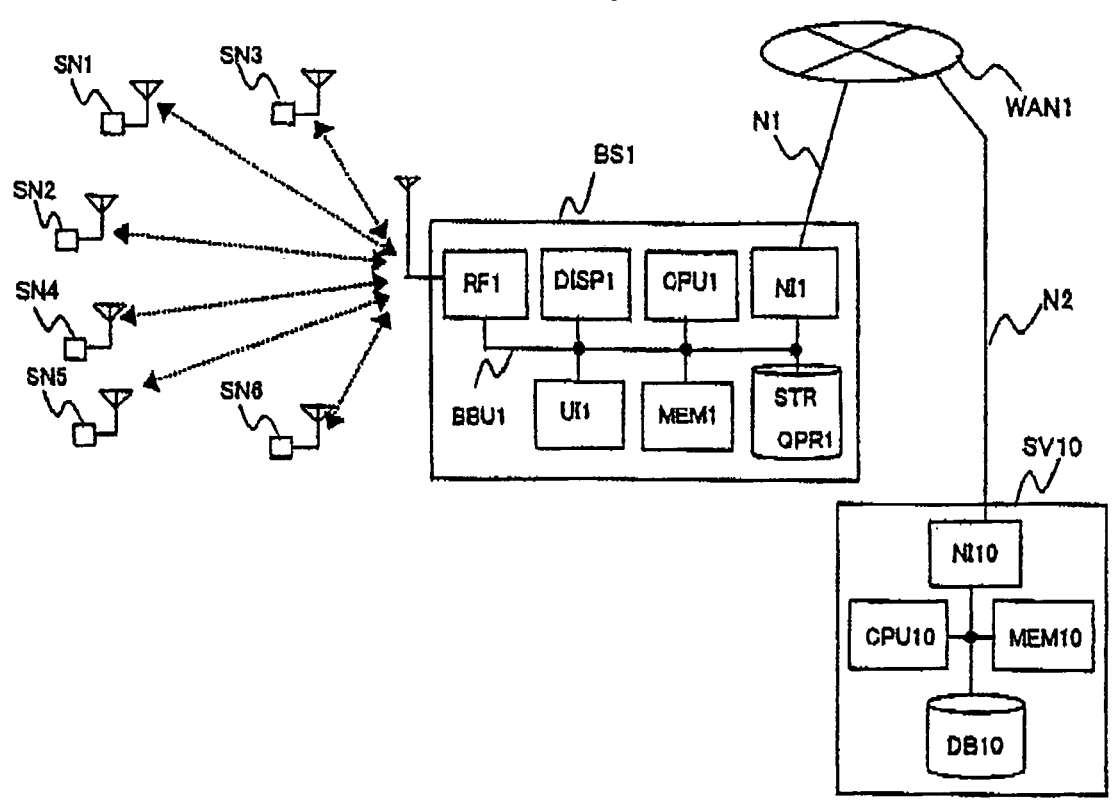
FIG. 16 is a view showing a configuration example of a sensor net system implemented with the sensor node of the present invention.

FIG. 16 shows an example of a sensor net system configured by using sensor nodes according to the present invention. With reference to FIG. 16, reference numerals SN1 to SN6 denote the sensor nodes according to the present invention. For example, the sensor nodes are placed everywhere in a building to perform air-conditioning in the entirety of the building. The sensor nodes thus disposed perform radio communication with a base station BS1, and the sensed temperature data is transmitted. The base station BS1 is configured of an antenna ANT1, a radio communication interface RF1, a processor CPU1, a memory MEM1, a secondary storage device STR1, a display device DISP1, a user interface device UI1, and a network interface device NI1. Of these components, the secondary storage device STR1 is typically configured of hardware and the like. The display device DISP1 is configured of a CRT and the like, and the user interface device UI1 is configured of a keyboard, a mouse, and the like. FIG. 17 shows a data structure of sensor data that is transmitted from the sensor node to the base station in the system. The base station BS1 performs radio communication with the sensor node through a radio interface/antenna, and reads measurement data such as temperature data. In the base station BS1, on the basis of the received measurement data and in accordance with a quality determination program QPR1 stored in the secondary storage device STR1 or the memory MEM1, temperature control of the entirety of the building is performed. Further, the base station BS1 is capable of communicating with a management server SV10 located in a remote site via the network interface device NI1 and through a wide area network WAN1 represented by the Internet or the like.

With the sensor node of the present invention being used, since the sensor node has high reception sensitivity, communication can be securely performed with the base station when the base station is spaced away at a long distance. That is, since the number of base stations can be reduced, costs necessary to install the sensor net system can be significantly reduced. Further, since the battery life in the sensor node of the present invention is long, the sensor node can be continually operated without causing the problem that the battery is frequently replaced. Consequently, maintenance costs for the overall sensor net system can be significantly reduced, and the sensor net system having desired functions can be built at low costs.

In accordance with the present invention, a sensor node operable with low power consumption is provided, thereby enabling the sensor net system adaptable in various fields.

What is claimed is:

1. An electronic device comprising:
   a board;
   a connector for connecting a sensor;
   a first signal processor circuit receiving an input of sensor data from said sensor through said connector and forming transmission data;
   a second signal processor circuit converting said transmission data from said first signal processor circuit into a high-frequency signal,
   wherein said connector and said first signal processor circuit are mounted on a first surface of said board, and said second signal processor circuit is mounted on a second surface of said board; and an antenna which is disposed on said second surface of said board, wherein each center of a lamination plane of said first signal processor circuit and said second signal processor circuit on said surface of said board is on one half side of said surface, and both said antenna and said connector are on the other half side of said surface.

2. An electronic device according to claim 1,
wherein said board is provided with shield layers for restraining transfer of noise generated in said first signal processor circuit to said second signal processor circuit.

3. An electronic device according to claim 2,
wherein said shield layers are provided inside said board.

4. An electronic device according to claim 2,
wherein a first plane layer to which a first potential is applied and a second plane layer to which a second potential is applied are provided as said shield layers, and
said first potential is a reference potential of said first signal processor circuit and said second potential is a power-supply potential of said first signal processor circuit.

5. An electronic device according to claim 4,
wherein said first plane layer is formed as a layer closer to said second surface of said board than said second plane layer.

* * * * *